United States Patent [19]

Hayes et al.

[11] Patent Number: 4,667,152
[45] Date of Patent: May 19, 1987

[54] METHOD OF AND SYSTEM FOR DETERMINING LOCATIONS OF SOURCES OF HARMONICS IN A POWER DISTRIBUTION NETWORK

[76] Inventors: Raymond M. Hayes, 5505 Rauch Rd., Carroll, Ohio 43112; Thomas L. Kirkpatrick, 2927 Northern Woods La., Columbus, Ohio 43229; John L. Lauletta, 2011 Westbranch Rd., Grove City, Ohio 43123; Timothy C. Shuter, 623 Fairholme Rd., Gahanna, Ohio 43230; Harry T. Vollkommer, Jr., 11804 Village Way, Pickerington, Ohio 43147

[21] Appl. No.: 788,576

[22] Filed: Oct. 17, 1985

[51] Int. Cl.$^4$ ............................................. G01R 21/06
[52] U.S. Cl. ..................... 324/77 R; 324/52; 324/83 D
[58] Field of Search .............. 324/77 R, 78 R, 78 D, 324/82, 83 R, 83 D, 52; 364/483; 307/498, 514, 525, 529; 328/160; 361/65, 79, 85

[56] References Cited

U.S. PATENT DOCUMENTS

| | | | |
|---|---|---|---|
| 4,063,164 | 12/1977 | Lanz et al. | 324/52 |
| 4,249,124 | 2/1981 | DeMesmaeker | 324/52 |
| 4,251,766 | 2/1981 | Souillard | 324/52 |
| 4,316,254 | 2/1982 | Levin et al. | 324/83 D |
| 4,492,918 | 1/1985 | Hernandez et al. | 324/83 D |
| 4,560,922 | 12/1985 | Heller et al. | 324/52 |

Primary Examiner—Stewart J. Levy
Assistant Examiner—Kevin D. O'Shea
Attorney, Agent, or Firm—Lowe Price LeBlanc Becker & Shur

[57] ABSTRACT

Current and voltage waveforms on the branches of each node of a power distribution network are sampled. The samples are converted to digital signals which are resolved into spectral components and processed to obtain the power (KVA) phasor at each frequency (harmonic component) of interest. The phase angles of the phasors describe the directions of movement, and thereby the locations of the sources, of the power harmonics in the network. A summary report is generated.

12 Claims, 10 Drawing Figures

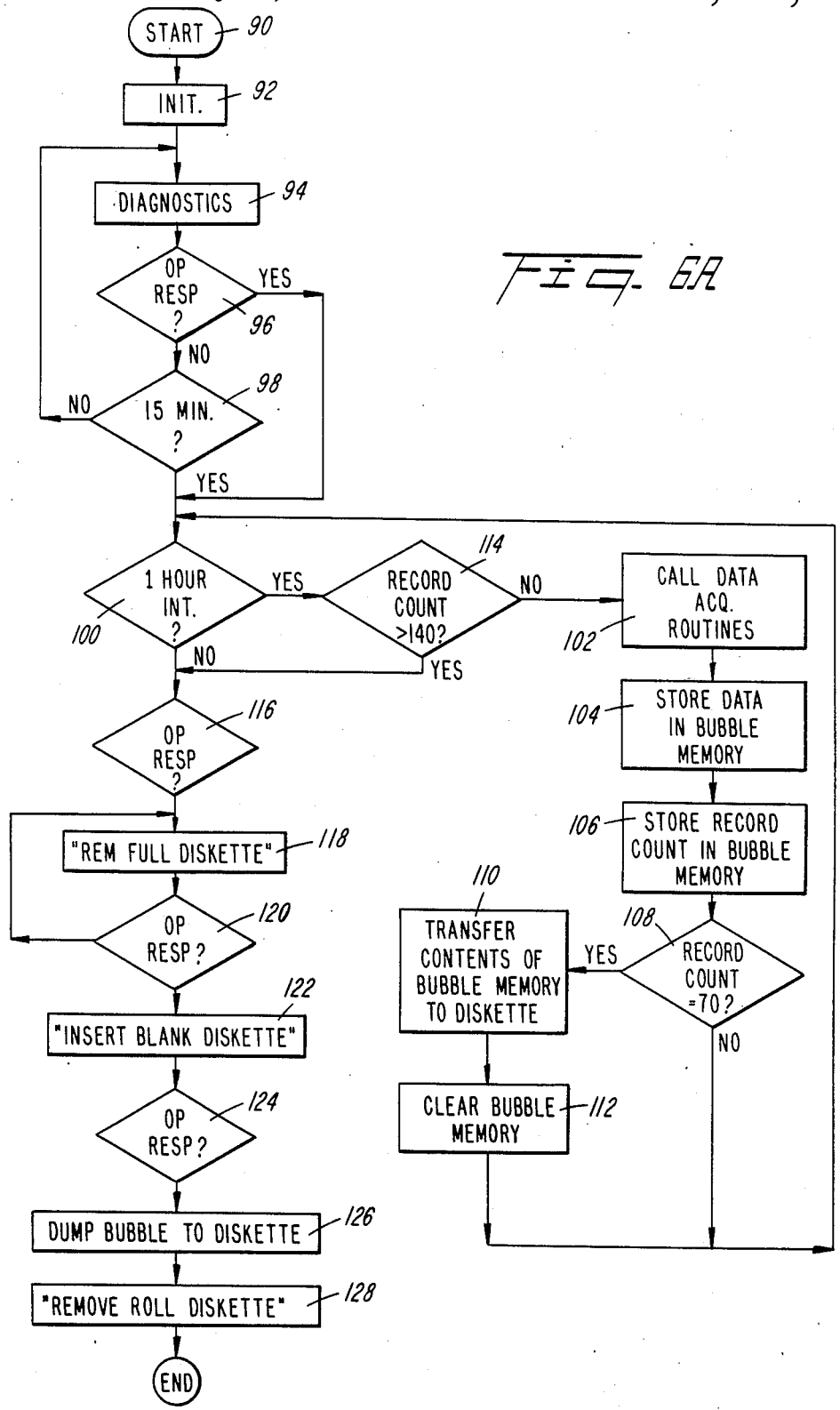

METHOD OF AND SYSTEM FOR DETERMINING LOCATIONS OF SOURCES OF HARMONICS IN A POWER DISTRIBUTION NETWORK

TECHNICAL FIELD

The invention relates generally to measurement of harmonics on power distribution networks, and more particularly, toward a method of and system for determining locations of power harmonic sources relative to reference nodes in a power distribution network.

BACKGROUND ART

Harmonic frequencies of fundamental power system waveforms have recently become a concern to electric power utilities. Harmonics on the power lines cause excessive losses in induction and synchronous machines and tend to create over-voltages and excessive currents as a result of resonance to harmonic voltages and currents on the network. In addition, harmonics tend to cause capacitor bank failure from dielectric breakdown or reactive power overload, and interfere with microprocessor control systems and other circuitry synchronized to the power lines.

Harmonics are created in power distribution networks by non-linear loads resulting from new technologies such as silicon-controlled rectifiers, power transistors and microprocessor controls which create load-generated harmonics throughout the network. Furthermore, power devices and equipment now are more critically designed and, when iron-core devices are involved, tend to operate more into their inherently non-linear regions.

Utilities thus now are beginning to set standards limiting injection of harmonics into power distribution networks. To intelligently select a standard and effectively enforce it, however, the harmonic content of existing networks must be characterized. There accordingly exists a need to monitor the harmonic content of power distribution networks, to enable standards to be established, and to determine the locations of harmonic sources so that corrective action, if appropriate, can be taken.

One object of the invention, therefore, is to provide a method of and system for monitoring harmonics in power distribution networks.

Another object is to provide a method of and system for identifying the magnitudes and phase angles of power harmonics on electrical power distribution networks.

A further object is to provide a method of and system for determining the locations of power harmonic sources relative to reference nodes within power distribution networks.

A further object is to provide line monitoring apparatus for the above purposes that accumulate and analyze harmonic component data automatically to generate summary reports.

DISCLOSURE OF INVENTION

Current and voltage waveforms are monitored at least at (n−1) branches of an n branch node within a power distribution network, sampled and stored. The stored samples are resolved into their spectral components to compute the power (KVA) phasor at each frequency (harmonic component) of interest. The thereby obtained power harmonic components are analyzed vectorially to determine, based upon their phase angles, the direction of the source of each power harmonic with respect to the node. By determining the directions of all branch harmonic sources with respect to each node, the harmonic sources within the network can be located.

In accordance with the further aspect of the invention, the phasor quantities representing the power harmonic components in the (n−1) branches of an n-branch node are summed vectorially to additional phasors representing the power harmonic components in the remaining (residual) branch of that node. Transducers for measuring the current and voltage waveforms thus may be eliminated in one branch of each node.

To develop a report of harmonic components in the power distribution network that is meaningful, yet concise, power harmonic components that are smaller than a predetermined percentage, e.g., 1%, of the corresponding harmonic at the fundamental frequency, are filtered out; only the more significant power harmonic components are processed for reporting.

The apparatus comprises voltage and current transducer means for monitoring voltage and current waveforms on at least (n−1) branches of each n-branch node of the power distribution network. Sampling circuitry driven by the transducer means develops current and voltage waveform samples in the analog domain. An analog to digital converter means digitizes the analog waveform samples, to be first stored in a bubble memory device, and thereafter downloaded to a bulk memory device, such as a magnetic disk. The raw current and voltage waveform digital data are then transferred to a computer which performs a spectral analysis to obtain as a digital output signal phasors representing the line power harmonics distributed through the network. These power harmonics are filtered to eliminate insignificant power harmonic components and formatted to develop a report describing the distribution of harmonics in the power network and identifying the direction relative to a reference node of each harmonic source.

Still other objects and advantages of the present invention will become readily apparent to those skilled in this art from the following detailed description, wherein we have shown and described only the preferred embodiment of the invention, simply by way of illustration of the best mode contemplated by us of carrying out our invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 6A-6C are a flow chart describing programming of computer shown in FIG. 5.

BEST MODE FOR PRACTICING THE INVENTION

Figure 1:
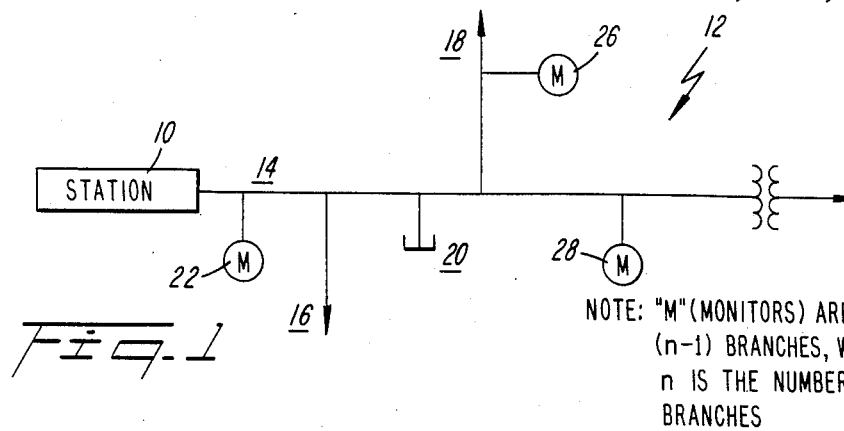
FIG. 1 is a diagram of a portion of a power distribution network monitored at four branches of a reference node, in accordance with the invention.

In FIG. 1, a power generating station 10 supplies electric power to a region over a power distribution network 12 that comprises a main line 14 from which extend a number of branches such as 16 and 18 representing customer loads or lateral feeders. Also at the line 14 are capacitor banks, such as 20, for power factor correction in a conventional manner. Monitor packages 22, 24, 26 and 28 measure current and voltage harmonics at each section or branch of the network. Monitor 22, for example, measures the current and voltage harmonics leaving or entering station 10 into or from the line 14 and the monitor 26 measures components leaving or entering the branch 14 to lateral feeder branch 18. The monitor 28 measures the current and voltage harmonic components flowing into or away from the customer load. The monitor 24 measures the current and voltage at the capacitor branch. However, there is no monitor at branch 16 since, as shall be described, the current and voltage harmonic components flowing into or away from branch 16 can be calculated using vector summation of the phasor components of the harmonic components in the remaining branches. Branch 16 shall be referred to hereinafter as a "residual branch". Current and voltage harmonic components measured by the monitor packages 22, 24, 26, 28 are combined to obtain the power harmonics within the network. The power harmonics are processed, using phasor analysis, to determine the direction of each at each node of the network. Thereby, the location of each harmonic source can be deduced.

Figure 2:
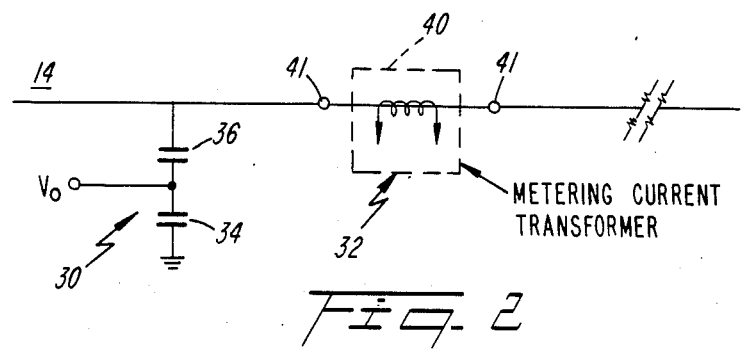
FIG. 2 is a diagram showing current and voltage waveform transducers used in the invention.

FIG. 2 shows in more detail the contents of each monitor package, such as monitor 22 in FIG. 1. Each package comprises a voltage transducer 30 and a current transformer 32, both coupled to the line 14 to measure voltage and current waveforms, respectively. Voltage transducer 30 preferably is a capacitively coupled potential device (CCPD) that comprises first and second capacitors 34, 36, in series with each other between the line 14 and ground. The output of the CCVT 30, at the top between the two capacitors 34 and 36, is a function of the fixed values of the two capacitors and the instantaneous amplitude of the voltage on the line 14.

The current transformer 32 is a standard metering current transformer having a response adequate to 5,000 Hertz. The current transformer is connected into the power conductor by opening the conductor and attaching its ends to lugs 41 on the current transformer, as shown in FIG. 2. Other types of current transformers, such as line post current sensors or split core current transformers, could be used, although the standard metering current transformer shown is preferred.

In accordance with one aspect of the invention, current and voltage waveforms are monitored at each branch of a node, sampled and converted to digital current and voltage waveform samples. The digital samples are resolved by a spectrum analyzer into their spectral components in the form of phasor quantities, and corresponding current and voltage harmonic components are multiplied together vectorially to obtain power harmonic component phasors. The power phasors then are analyzed to obtain the direction of each power harmonic component on each branch, to determine the source of that harmonic relative to the node to which the monitored branches are connected.

Figure 3:
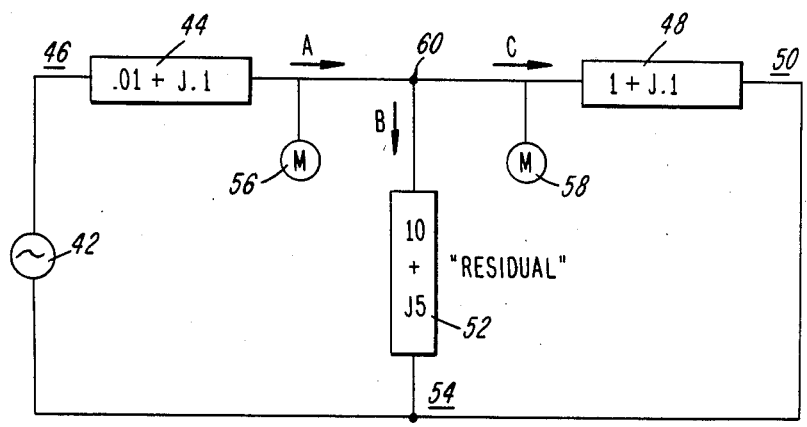
FIG. 3 is a schematic representation of a measurement node with its branches having exemplary loads for which calculations to determine the phasor components are made.

For example, consider the simplified network shown in FIG. 3, with power source 42 and source impedance 44 on input branch 46, a customer load impedance 48 on branch 50 and a residual impedance 52 on residual branch 54. Assume further that monitor 56 measures current and voltage waveforms on branch 46 and that monitor 58 measures current and voltage waveforms on branch 50; no monitor is connected to residual branch 54. The source impedance in this example is [0.01+j.1]; the customer load impedance is [1+j.1] and the residual impedance is [10+J5]. All three impedances are connected to node 60. The source 42 generates an alternating current voltage of 10,000 volts peak.

Table 1 is a summary of the voltage and current harmonic components at multiples of 20 Hertz measured by monitor package 56 on branch 46; the table entries are amplitude normalized to 60 Hertz, that is, the amplitude of each current and voltage harmonic component is expressed as a percentage of the amplitude of the respective 60 Hertz component. Thus, the fundamental voltage component (60 Hz.) measured by package 56 has a phase angle of −5.90° (column 1) and the fundamental current component (column 2) has an angle of −13.3°; the magnitude of each is normalized at 100. The voltage and current at the 180 Hertz harmonic have, respectively, phasors of magnitudes/phase angles of 2.05%/66.3° respectively. At 300 Hertz, the voltage harmonic component is at 4.2%/57.5° and the corresponding current harmonic component is at 7.75%/148.4°.

Other voltage and current harmonics have much smaller magnitudes, i.e., less than 1% of the corresponding magnitude of the fundamental.

The third column of Table 1 represents the admittance vector normalized based upon 60 Hz values of branch 46 at the respective frequencies indicated.

Table 2 is a corresponding summary of current, voltage and impedance quantities obtained by monitor 58 on branch 50. Note again that the 60 Hertz voltage and current components are normalized at 100%, and that only the current and voltage harmonic components at 180 Hertz and 300 Hertz have magnitudes greater than 1% of the fundamental (60 Hertz) components. The components having magnitudes nitudes greater than 1% of the corresponding magnitudes of the fundamental, shall be referred to hereinafter as the "significant" components.

The "significant" power harmonic components associated with each of the current and voltage harmonics at 180 and 300 Hertz as well as at 60 Hertz, are shown in Table 3. In example, each power harmonic is obtained by multiplying together the phasor quantities representing corresponding voltage conjugate of current harmonics of Tables 1 and 2 at each frequency. At 60 Hertz, for example, the power (in KVA) in branch 46 is 101698/+7.4°. This is obtained from Table 1, by multiplying together corresponding measured voltage and current magnitudes (not the normalized magnitudes) and the phase angles shown. Similarly, the power in branch 50 at 60 Hertz is obtained from the corresponding entries in columns 1 and 2 in Table 2.

Figure 4A:
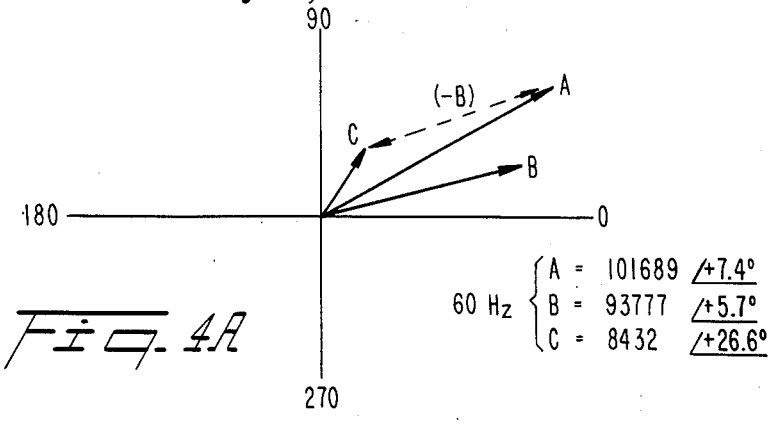
FIGS. 4A–4C are diagrams showing vector summation of phasors corresponding to the equivalent circuit of FIG. 3 for calculating residual branch harmonic components.

The power in residual branch 54 is computed by vector summation of the powers in branches 45 and 50. This is clear by inspection of FIG. 3, wherein the power flowing in branch 46 splits at node 60 into branches 50 and 54. The power in branch 54 thus is equal to the difference between the power in branch 50 and the power in branch 46. Referring to FIG. 4A, the phasor representing 60 Hertz power in branch 46 is identified by A, and the p representing the power in branch 50 by B. The power in residual branch 54, which is the difference between phasors A and B, is identified by C, corresponding to corresponding phasor quantities in Table 3.

Figure 4B:
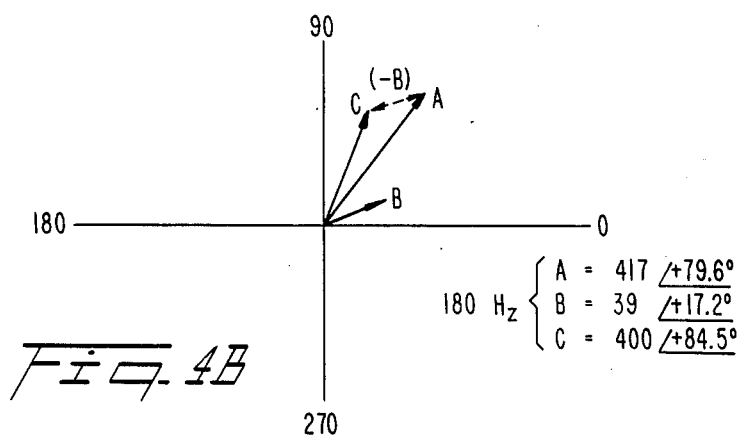
Figure 4C:
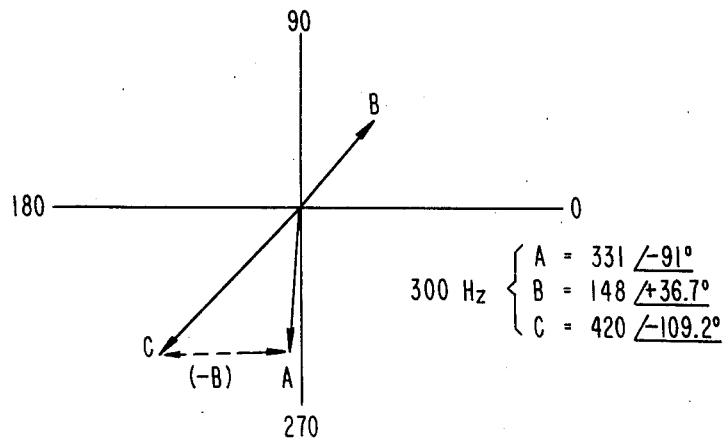

The power harmonic components at 180 Hertz and 300 Hertz in all three branches are determined similarly, as shown in Table 3 and FIGS. 4B, 4C. The data in Table 3 are now analyzed to identify the direction of each power harmonic component in each branch relative to node 60, and thereby to determine the direction relative to that node of the source of the respective harmonic component. This enables the utility to determine, through successive nodal analyses of this type, the source of each harmonic component in the distribution network.

For example at 60 Hertz, the power in branch 46 in the example given is at 101698 KVA/+7.4°. This indicates a substantial real component of power flowing away from the source 42. Similarly, within branch 50, the power flowing therein has an amplitude of 93777 and a phase angle of +5.7°, again indicating a subs real component of power, flowing away from the node and into the branch. The residual power in branch 54 has a magnitude of 8432 KVA and a phase angle of +26.6°. This branch thus is absorbing real power; the power is again flowing away from the node.

The 180 Hz power harmonic component in branch 46 has a magnitude of 417 KVA and a phase angle of +79.6°. There accordingly is a small real power flow, with current lagging voltage; real power on branch 54 flows away from the node. In branch 50, there is a power flow of 39 KVA at a phase angle of +17.2°; again, real power flow is into the branch 50 away from the node. The power flow in residual branch 54 has a magnitude of 400 KVA and phase angle of +84.5°. This indicates significant reactive power injection into the branch, and signifies that real power continues to flow from the node into the residual branch 54.

At the 300 Hertz power harmonic component, however, there is a very high reactive flow and a small real power flow in branch 46. The power in branch 46 is 331 KVA and at an angle of −91°. There accordingly is a small real power flow node 60 into source 42. In branch 50, there is power flow at a magnitude of 148 KVA and a phase angle of +26.7°, again indicating a relatively small real power flow away from the node. The residual branch 54 carries a power flow of 420 KVA at −109.2°, indicating that real power flow is from the branch into the node 60.

In other words, the only source of 60 and 180 Hertz real power components is source 42. There is, however, another source of 300 Hertz harmonic real power component that flows into 60.

If additional branches and nodes are involved, the analysis can be extended to pinpoint the source of each harmonic component in the power distribution network.

Figure 5:
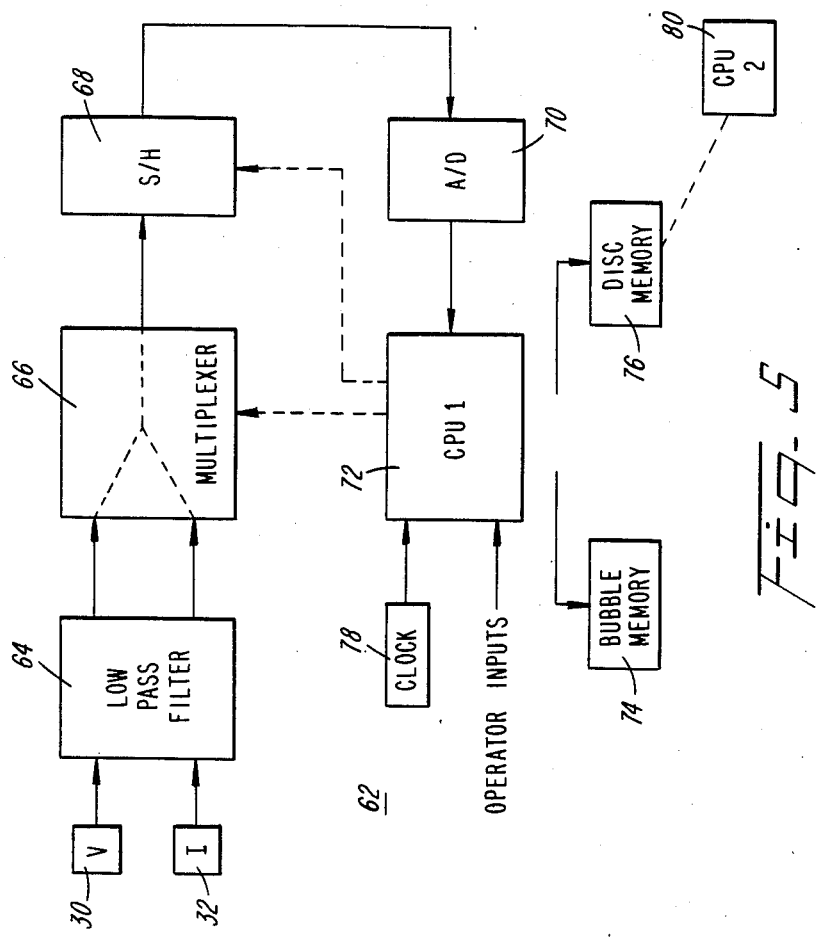
FIG. 5 is a block diagram of circuitry for practicing the invention.

Referring now to FIG. 5, a system 62 for implementing the above analysis comprises low pass filters 64 to which are applied the outputs of voltage and current transducers 30 and 32 to eliminate aliasing frequencies. This avoids signal propagation with frequencies that may corrupt the current and voltage waveform data. The filter preferably is a dual switched capacitor filter configured as a fourth order Butterworth filter, to provide high attenuation at a low error near the cutoff frequency.

The output of filter 64 is applied to a multiplexer 66 which passes, alternately, the instantaneous voltage and current analog values to a sample and hold circuit 68, wherein the analog values are sampled and stored. The current and voltage samples, which are in the analog domain, are digitized by an analog to digital converter 70, to develop digital words or bytes corresponding to the instantaneous current and voltage levels at the sample times.

The digitized voltage and current waveforms are collected by a microcomputer 72, such as an IBM Personal Computer, where the digitized current and voltage samples first are stored in a bubble memory 74 and then, when the storage capacity of the bubble memory has been reached, transferred to a magnetic disk memory 76. The purpose of storing the digitized current and voltage waveform data first in bubble 74 is to improve reliability of the system by providing primary data storage within a storage medium having no moving parts.

The computer 72 receives a real time reference time from a real time clock 78, to "tag" data with the corresponding times of day. The computer 72 controls multiplexer 66 and sample and hold unit 68 to sample each of the current and voltage waveforms 20,480 times per second to collect 2,048 digitized samples. These samples are stored in bubble memory 74 until 70 sets of data (280 kilobytes of data), which is the capacity of a floppy disk, have been stored. A single block of 70 sets of data then is transferred to the disk memory 76, the bubble memory 74 reset and another 70 sets of data stored in the bubble memory. This provides approximately one week of data storage with 1,024 samples each of voltage and current collected each hour for 140 hours.

The floppy disk is removed from disk drive 76, a fresh disk inserted and the contents of a bubble memory 74 downloaded to the disk. Both disks, now full, contain digitized voltage and current waveforms that are transported to a CPU 80 which contains programming for, or operates with, a spectrum analyzer, such as a Hewlett-Packard Model 3582A Signal Analyzer.

The spectrum analyzer performs a spectral analysis of the voltage and current waveform samples, and returns discrete frequency real and imaginary data to the computer 80. These samples are multiplied together in the computer to obtain magnitudes and phase angles of significant power harmonic components, and tables for each monitor as a function of time are created. An example of such a report generated by the computer 80 is shown in Table 4.

Software for controlling the microcomputer 72 is shown in the flow chart of FIG. 6A. Following a start of the program at step 90, software variables as well as hardware are initiated, and the time of day clock 78 is set (step 92). Hardware diagnostics are executed (step 94), echoing the input waveforms to a digital-to-analog converter for operator inspection.

Each hour, automatically (step 100), data are downloaded from the working memory of computer 92 into bubble memory 74. Data acquisition routines (step 102) thus are called to obtain voltage and current waveform samples for storage in the bubble memory 74 (step 104). The record count in bubble memory is also stored (step 106) and when the record count is equal to 70 (step 108), the contents of the bubble memory are transferred to disk drive 76 (step 110), and the bubble memory is cleared (step 112).

Data acquisiton repeats for another 70 records, for a total of 140 records (step 114), each record containing one current and one voltage waveform represented digitally as 1024 12-bit integer quantities per waveform. This represents more than 5½ days of data, based upon 140 samples for each of two channels sampled at 10,240 samples per second each for 0.10 second plus overheads totaling 4,104 bytes per record.

Upon operator request (step 116), the full diskette from disk drive 76 (step 118) is removed, and upon further operator request (step 120), a new blank diskette is inserted into the drive 76 for the next 70 records (step 122). Upon an additional operator request (step 124), the contents of the bubble memory 74 are dumped to the second diskette (step 126) and the second full diskette is removed (step 128).

Figure 6B:
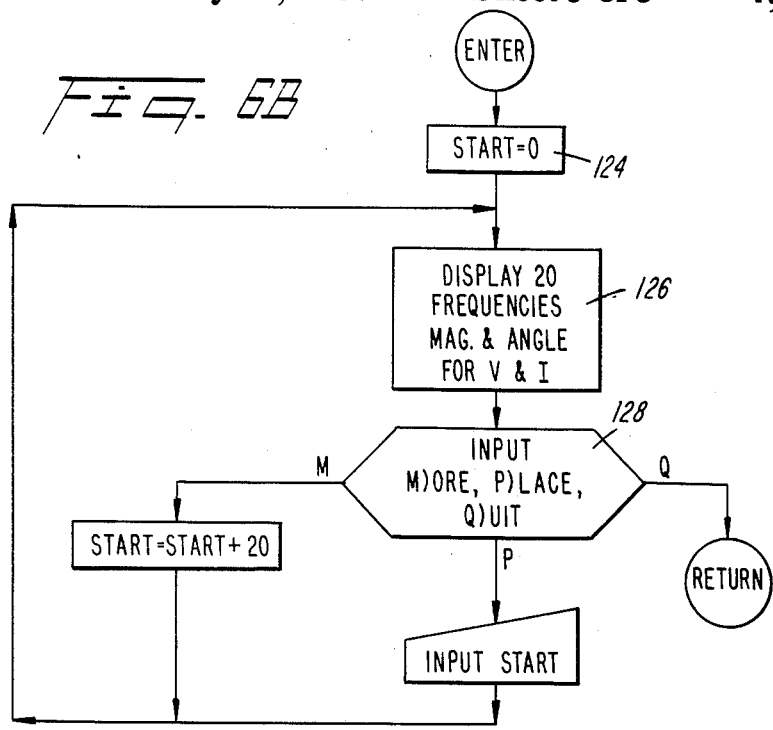

A program for operating CPU 80 to display a spectrum, shown in FIG. 6B, initializes a counter at step 124 and then displays a page of magnitude and phase angles for the voltage and current samples. This corresponds to the data set forth in Tables 1 and 2, infra (step 126). The program repeats or returns to "start" depending upon reply to user prompting (step 128).

Figure 6C:
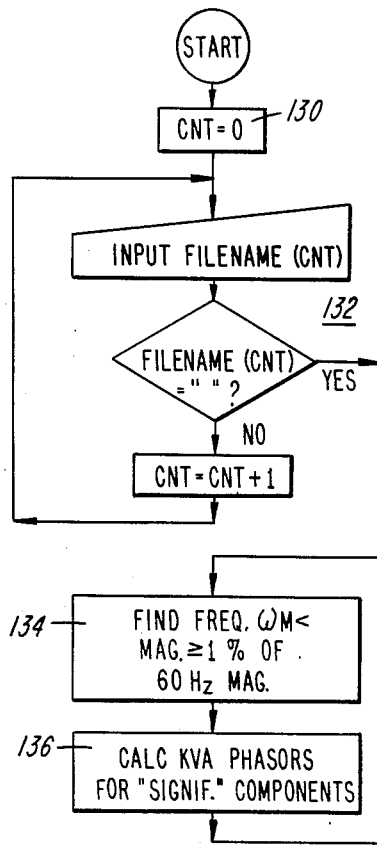
Figure 6C:
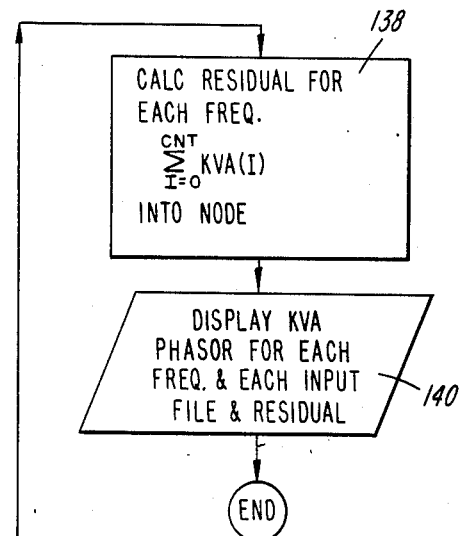

FIG. 6C is a flow chart of software for operating computer 80 to calculate power phasors for significant harmonic components, and calculating the residual power (the power in the residual branch) for each harmonic. Thus, the variable CNT is first initialized (step 130) and the first file is input at 132 for each phasor, and only those harmonics having magnitudes greater than or equal to 1% of the magnitude of the 60 Hertz component are selected (step 134). The KVA phasors for those significant components are calculated (step 136) and the residual for each frequency is computed by vector addition (step 138) in the manner indicated above. Finally, in step 140, the KVA phasor for each significant frequency, input file and residual are displayed in the report.

The report, shown in Table 3, enables the operator, by analyzing the phase angle of each harmonic component, to determine the direction of each component with respect to a reference node, until, ultimately, the source of each harmonic in the power distribution network is determined. This process can, of course, be carried out by inspection, or alternatively, by software implementation in a routine manner.

There thus has been provided a method of and system for determining the harmonic distribution on a power distribution network and, furthermore, determining the direction of the source of each power harmonic component with respect to reference nodes in the network. Current and voltage waveforms are measured at all but one branch of each node; waveforms on the remaining or "residual" branch may be computed by vector summation. The system generates a report summarizing the magnitude and phase angle of all significant voltage and current harmonic components as a function of time. Power harmonic components are computed from the current and voltage components, and phase angles analyzed to determine the direction of flow of each power harmonic component on each branch of the network and, thus, the location in the network of each harmonic source.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

TABLE 1

| DISPLAY BOX 1 | @60Hz CH A = 9708.046 | CH B = 10475.65 |
|---|---|---|
| FREQ  VOLTAGE (A) | CURRENT (B) | XFR B/A |
| 0    0.03 < 180.0° | 0.00 < 0.0° | 0.000 < −180.0° |
| 20   0.03 < 180.0° | 0.00 < −0.4° | 0.000 < 179.6° |
| 40   0.01 < 180.0° | 0.01 < 89.3° | 1.079 < −90.7° |
| 60   100.00 < −5.9° | 100.00 < −13.3° | 1.164 < −7.4° |
| 80   0.01 < 180.0° | 0.01 < 88.6° | 1.079 < −91.4° |
| 100  0.02 < −90.0° | 0.01 < 178.2° | 1.079 < −91.8° |
| 120  0.02 < 135.0° | 0.02 < 132.9° | 1.079 < −2.1° |
| 140  0.02 < 135.0° | 0.02 < 132.5° | 1.079 < −2.5° |
| 160  0.02 < −135.0° | 0.02 < −137.8° | 1.079 < −2.8° |
| 180  2.05 < 66.3° | 20.00 < −13.3° | 11.365 < −79.6° |
| 200  0.01 < 180.0° | 0.01 < −93.5° | 1.079 < 86.5° |
| 220  0.01 < −90.0° | 0.01 < 176.1° | 1.079 < −93.9° |
| 240  0.01 < −90.0° | 0.01 < 175.8° | 1.079 < −94.2° |
| 260  0.01 < −90.0° | 0.01 < 175.4° | 1.079 < −94.6° |
| 280  0.03 < 180.0° | 0.00 < −4.9° | 0.000 < 175.1° |
| 300  4.20 < 57.5° | 7.75 < 148.4° | 2.149 < 91.0° |
| 320  0.01 < 180.0° | 0.01 < 84.4° | 1.079 < −95.6° |
| 340  0.01 < 180.0° | 0.01 < 84.0° | 1.079 < −96.0° |
| 360  0.03 < 116.6° | 0.01 < 83.7° | 0.483 < −32.9° |
| 380  0.00 < 0.0° | 0.00 < 6.7° | %10000.000< −6.7° |

(M)ore, (P)lace, (Q)uit

TABLE 2

| DISPLAY BOX 2 | @60Hz CH A = 9708.046 | CH B = 10475.65 |
|---|---|---|
| FREQ  VOLTAGE (A) | CURRENT (B) | XFR B/A |
| 0    0.03 < 180.0° | 0.00 < 0.0° | 0.000 < −180.0° |
| 20   0.03 < 153.4° | 0.01 < 179.6° | 0.445 < 26.2° |
| 40   0.02 < 135.0° | 0.02 < 134.3° | 0.995 < −0.7° |
| 60   100.00 < −5.9° | 100.00 < −11.6° | 0.990 < −5.7° |
| 80   0.03 < 180.0° | 0.00 < −1.4° | 0.000 < 178.6° |
| 100  0.03 < 180.0° | 0.00 < −1.8° | 0.000 < 178.2° |
| 120  0.02 < −135.0° | 0.02 < −137.1° | 0.995 < −2.1° |
| 140  0.01 < 180.0° | 0.01 < 87.5° | 0.995 < −92.5° |
| 160  0.03 < 180.0° | 0.00 < −2.8° | 0.000 < 177.2° |
| 180  2.08 < 66.3° | 2.00 < 49.1° | 0.952 < −17.2° |
| 200  0.02 < −135.0° | 0.02 < −138.5° | 0.995 < −3.5° |
| 220  0.01 < −90.0° | 0.01 < 176.1° | 0.995 < −93.9° |
| 240  0.02 < 135.0° | 0.02 < 40.8° | 0.995 < −94.2° |
| 260  0.03 < 180.0° | 0.00 < −4.6° | 0.000 < 175.4° |
| 280  0.03 < 153.4° | 0.01 < −4.9° | 0.445 < −158.4° |
| 300  4.19 < 57.6° | 3.77 < 30.9° | 0.892 < −26.7° |
| 320  0.01 < 180.0° | 0.01 < −95.6° | 0.995 < 84.4° |
| 340  0.01 < 180.0° | 0.01 < 84.0° | 0.995 < −96.0° |
| 360  0.01 < 90.0° | 0.01 < 173.7° | 0.995 < 83.7° |
| 380  0.00 < 0.0° | 0.03 < −96.7° | %10000.000< −96.7° |

(M)ore, (P)lace, (Q)uit

TABLE 3

Monitored KVA flow. + Residuals are out of node.

| FREQ. | Input Branch 46 MAG/ANG | Output Branch 50 MAG/ANG | Residual Branch 54 ACTIVE/REACTIVE |
|---|---|---|---|
| 60  | 101698 < +7.4 | 93777 < +5.7 | +7539/+3776 |
| 180 | 417 < +79.6 | 39 < +17.2 | +38/+399 |
| 300 | 331 < −91.0 | 148 < +26.7 | −138/−397 |

TABLE 4

| | FREQ. = 60 | | 180 | | 300 | |
|---|---|---|---|---|---|---|
| TIME | MAG. | ANGLE | MAG. | ANGLE | MAG. | ANGLE |
| 00:00 | 12668 | 27 | 95 | 76 | 215 | 179 |
| 01:00 | 12576 | 28 | 109 | −55 | 211 | −163 |

TABLE 4-continued

| | FREQ. = 60 | | 180 | | 300 | |
|---|---|---|---|---|---|---|
| TIME | MAG. | ANGLE | MAG. | ANGLE | MAG. | ANGLE |
| 02:00 | 12529 | 28 | 47 | −142 | 175 | −21 |
| 03:00 | 12711 | 28 | 85 | 158 | 122 | 150 |
| 04:00 | 12416 | 27 | 167 | −35 | 60 | −173 |
| 05:00 | 12583 | 27 | 83 | 23 | 121 | −145 |
| 06:00 | 11670 | 24 | 167 | 176 | 162 | 14 |
| 07:00 | 12230 | 26 | 115 | −43 | 116 | 41 |
| 08:00 | 12337 | 26 | 155 | −20 | 99 | 126 |
| 09:00 | 12403 | 26 | 105 | 44 | 263 | −161 |
| 10:00 | 12454 | 26 | 216 | 160 | 132 | 146 |
| 11:00 | 12306 | 27 | 195 | 22 | 108 | −35 |
| 12:00 | 12101 | 27 | 174 | −152 | 67 | −136 |
| 13:00 | 12059 | 26 | 143 | 25 | 211 | −20 |
| 14:00 | 11828 | 26 | 83 | −39 | 92 | −133 |
| 15:00 | 11849 | 26 | 95 | 133 | 189 | 162 |
| 16:00 | 11531 | 26 | 125 | −175 | 126 | −160 |
| 17:00 | 11352 | 25 | 147 | −142 | 160 | 8 |
| 18:00 | 11083 | 25 | 64 | 109 | 64 | 17 |
| 19:00 | 10787 | 24 | 173 | −24 | 33 | −15 |
| 20:00 | 11029 | 25 | 92 | −75 | 115 | 33 |
| 21:00 | 10965 | 25 | 40 | 101 | 118 | 144 |
| 22:00 | 10906 | 24 | 39 | 64 | 90 | −47 |
| 23:00 | 10915 | 24 | 98 | 172 | 87 | 27 |

What is claimed is:

1. A method of determining the directions of locations of sources of power harmonic components relative to a node interconnecting n branches of a power distribution network, wherein n is an integer greater than two, comprising the steps of:
 (a) monitoring current and voltage waveforms at least in (n−1) of said branches;
 (b) sampling the current and voltage waveforms to obtain analog current and voltage samples;
 (c) converting the analog current and voltage samples to corresponding digital signals;
 (d) resolving said digital current and voltage signals their respective spectral components;
 (e) multiplying together corresponding ones of said and voltage spectral components to obtain phasors representing power harmonic components on each said branches; and
 (f) processing said phasors to determine the direction of flow of each said power harmonic.

2. The method of claim 1, wherein the monitoring step includes monitoring current and voltage waveforms in (n−1) said branches, and including, following step (e), the additional step of vectorially summing said phasors to determine residual power harmonics in the remaining one of said branches.

3. The method of claim 1, including the steps of identifying as a function of magnitude significant harmonic components, and wherein step (f) includes processing only said significant harmonic components.

4. The method of claim 1, including storing said voltage and current samples and displaying a harmonic content of each branch.

5. A system for determining directions of locations of sources of power harmonics relative to a node interconnecting n branches of a power distribution network, where n is an integer ≧2, comprising:
 voltage transducer means for monitoring voltage waveforms in at least (n−1) of said n branches;
 current transducer means for monitoring current waveforms in said at least (n−1) branches;
 means for sampling said current and voltage waveforms to obtain analog current and voltage waveform samples;
 A/D converter means for digitizing said analog waveform samples;
 spectrum analyzer means for resolving said digitized samples into their respective harmonic components;
 means for multiplying together corresponding ones of said current and voltage harmonic components to obtain power harmonic components in the form of phasor quantities; and
 means for monitoring phase angles of said phasor quantities to determine the directions of flow of said power harmonics within each of said n branches of said node and thereby determine the directions of locations of said sources relative to said node.

6. The system of claim 5, including storage means for storing said digital waveform samples, and display means for displaying said samples.

7. The system of claim 6, wherein said storage means includes a bubble memory.

8. The system of claim 7, wherein said storage means further includes a bulk memory device, and means for transferring data stored in said bubble memory to said bulk memory device.

9. The system of claim 5, including a level discrimination means for identifying significant power harmonic components having a magnitude greater than a predetermined magnitude, and wherein said monitoring means is responsive only to said significant harmonic components.

10. The system of claim 6, wherein said displaying means comprises a printer.

11. The system of claim 5, wherein said voltage transducer means comprises a capacitively coupled voltage transformer.

12. The system of claim 5, wherein said current transducer means comprises a current transformer and current shunt of known resistance and inductance.

* * * * *